(12) United States Patent
Chambers

(10) Patent No.: US 7,855,341 B2
(45) Date of Patent: Dec. 21, 2010

(54) METHODS AND APPARATUS FOR A FLEXIBLE CIRCUIT INTERPOSER

(75) Inventor: Douglas C. Chambers, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/165,203

(22) Filed: Jun. 30, 2008

(65) Prior Publication Data

US 2008/0290342 A1 Nov. 27, 2008

Related U.S. Application Data

(60) Continuation of application No. 11/306,658, filed on Jan. 5, 2006, now Pat. No. 7,392,584, which is a division of application No. 10/323,221, filed on Dec. 18, 2002, now Pat. No. 7,071,420.

(51) Int. Cl.
*H05K 1/00* (2006.01)
(52) U.S. Cl. .................................... 174/254; 174/262
(58) Field of Classification Search .............. 174/254, 174/262–266; 361/749–751, 792–795
See application file for complete search history.

(56) References Cited

U.S. PATENT DOCUMENTS

| | | | |
|---|---|---|---|
| 3,923,359 A | 12/1975 | Newsam | |
| 4,548,451 A | 10/1985 | Benarr et al. | |
| 5,262,594 A * | 11/1993 | Edwin et al. | 174/254 |
| 5,590,460 A | 1/1997 | DiStefano et al. | |
| 5,759,047 A | 6/1998 | Brodsky et al. | |
| 5,984,691 A | 11/1999 | Brodsky et al. | |
| 5,999,097 A * | 12/1999 | Liddle et al. | 340/550 |
| 6,041,495 A | 3/2000 | Yoon et al. | |
| 6,047,469 A | 4/2000 | Luna | |
| 6,670,700 B1 | 12/2003 | Hashimoto | |
| 6,765,288 B2 | 7/2004 | Damberg | |
| 6,797,888 B2 * | 9/2004 | Ookawa et al. | 174/255 |
| 6,815,621 B2 | 11/2004 | Park et al. | |
| 7,057,116 B2 * | 6/2006 | Reid et al. | 174/260 |
| 7,071,420 B2 | 7/2006 | Chambers | |
| 7,115,986 B2 | 10/2006 | Moon et al. | |
| 7,149,095 B2 * | 12/2006 | Warner et al. | 361/803 |
| 7,201,583 B2 | 4/2007 | Boggs et al. | |
| 7,271,016 B2 | 9/2007 | Chambers | |
| 7,319,273 B2 | 1/2008 | Chambers | |
| 2006/0196047 A1 | 9/2006 | Chambers | |

* cited by examiner

*Primary Examiner*—Jeremy C Norris
(74) *Attorney, Agent, or Firm*—Fletcher Yoder

(57) ABSTRACT

A substrate having a bending region and conductive paths formed therethrough is provided. In one embodiment, conductive paths are formed from a first region on the bottom surface of the substrate, through the bending region and to a second region on the top surface of the substrate. Methods of using the flexible substrate are also provided.

13 Claims, 5 Drawing Sheets

METHODS AND APPARATUS FOR A FLEXIBLE CIRCUIT INTERPOSER

CROSS-REFERENCE TO RELATED APPLICATIONS

This Application is a continuation of and claims priority to U.S. application Ser. No. 11/306,658, filed on Jan. 5, 2006, now U.S. Pat. No. 7,392,584 which issued on Jul. 1, 2008, which is a divisional of U.S. application Ser. No. 10/323,221, filed on Dec. 18, 2002, now U.S. Pat. No. 7,071,420 which issued on Jul. 4, 2006.

FIELD OF INVENTION

The present invention relates, generally, to semiconductor device testing and, more particularly, to a flexible circuit interposer.

BACKGROUND OF INVENTION

Recent advances in semiconductor fabrication techniques have dramatically increased the density and speed of semiconductor devices, leading to a corresponding effort in the field of semiconductor packaging, where increased device density gives rise to many challenges related to electrical connectivity, heat-transfer, manufacturability, and the like. In this regard, a major trend in semiconductor packaging is toward low-profile, high-density device packages such as the various ball grid array (BGA) and fine ball grid array (FBGA) packages.

This increase in device density also poses problems for board-level testing, assembly qualification, debug, and other such test procedures. Modern printed circuit boards (PCBs) and modules typically include a large number of devices in a relatively small space. As a result, it is often difficult or impossible to electrically probe individual devices (particularly BGA devices) during testing, as the required bond pads or contacts are not typically exposed for easy access.

Known methods of facilitating device testing include the insertion of "interposers" between the device and board. These interposers typically include a series of probe contacts provided one or more sides of the device under test. Space limitations in high-density assemblies prohibit the use of such large, rigid interposers to provide probing capability, as surrounding devices often interfere with optimal placement of such interposers. Furthermore, this class of interposer may detach from the board or reflow during subsequent attachment of the semiconductor device to the interposer pads.

Moreover, known interposers are unsatisfactory in that they provide a single probe point for each terminal. This limitation reduces test flexibility and makes it extremely difficult to determine where continuity issues may exist, for example, open circuits resulting from mechanical overstress of conductive traces formed within the interposer.

SUMMARY OF INVENTION

A method and apparatus for a flexible circuit interposer according to various aspects of the present invention includes a flexible circuit substrate which allows in-situ probing of an attached device during, for example, circuit debugging, assembly qualification, and the like. In accordance with one embodiment, a first set of pads (for example, bond pads configured to interface with solder balls) are configured in a predetermined pattern on the bottom surface of a flexible substrate. Similarly, a second set of pads are configured in substantially the same pattern on the top surface of the flexible substrate, wherein each of the pads in the second set of pads is electrically continuous with a corresponding pad in the first set of pads. A third set of pads are configured in the same pad pattern on the top surface of the flexible substrate. One or more conductive traces are formed to connect one or more pads in the first set of pads with spatially-corresponding pads in the third set of pads. A fourth set of pads corresponding to the third set of pads may also be provided on the bottom surface of the flexible substrate.

In accordance with one aspect of the present invention, the first set of pads are configured to interface with a printed circuit board, and the third set of pads are configured to interface with a semiconductor device (for example, a ball grid array (BGA) device). Thus, the second set of pads (and/or the fourth set of pads) may be probed while the semiconductor is in an operational state. The flexibility of the interposer allows the device to be advantageously positioned within the test apparatus.

BRIEF DESCRIPTION OF THE DRAWINGS

Additional aspects of the present invention are evident upon reviewing the non-limiting embodiments described in the specification and the claims, in conjunction with the accompanying figures, wherein like numerals designate like elements:

Elements in the figures are illustrated for simplicity and clarity and have not necessarily been drawn to scale. For example, the dimensions of some of the elements in the figures may be exaggerated relative to other elements to improve understanding of embodiments of the present invention.

DETAILED DESCRIPTION

Various aspects and features of the present invention may be described in terms of functional components and steps. Such functional components and steps may be realized by any number of elements and/or steps configured to perform the specified functions. For example, the present methods and apparatus may employ electronic, signaling, and logic elements which may carry out a variety of functions in various embodiments, applications, and environments. In addition, the present methods and apparatus may be practiced in conjunction with any number of procedures and systems, and the apparatus and methods described are merely exemplary applications for the invention. Further, the present methods and apparatus may employ any number of packaging techniques, conventional or otherwise, for placement, use, manufacturing, and the like.

Figure 1:
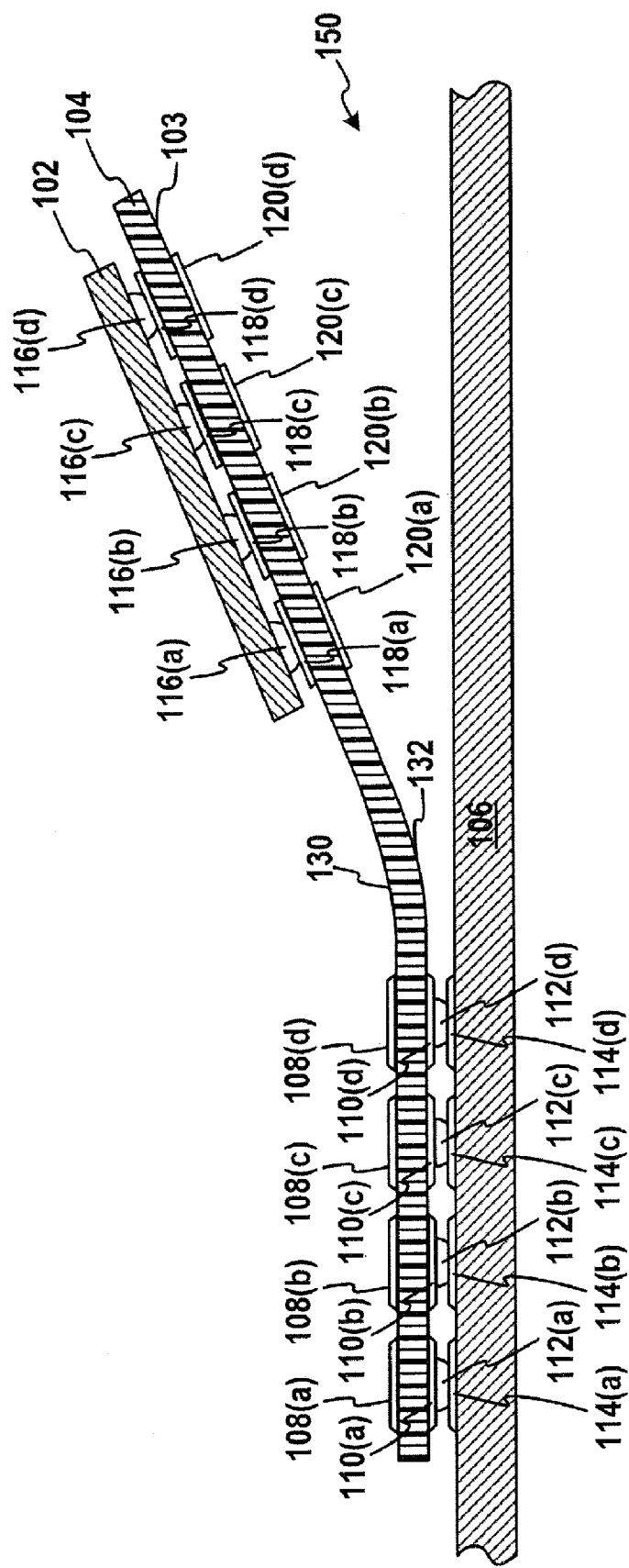
FIG. 1 is side view diagram illustrating a flexible circuit interposer in accordance with the present invention attached to a printed circuit board and a semiconductor device.

FIG. 1 shows a flexible circuit interposer 103 in accordance with various aspects of the present invention disposed in one possible context—that is, interposed between a semiconductor device 102 and a board 106. Interposer 103 includes a set of pads 110 that are configured in a predetermined pattern (for example, a ball-grid array pattern) on the bottom surface 132 of a flexible substrate 104. Similarly, a second set of pads 108 are configured in substantially the same pattern on the top surface 130 of flexible substrate 104, wherein each of the pads in the second set of pads 108 is electrically continuous with a corresponding pad in the first set of pads 110 (linked, for example, by through-holes as described further below).

A third set of pads 118 is configured in the same pad pattern on the top surface 130 of flexible substrate 104. One or more pads in the first set of pads 110 are electrically continuous with one more spatially-corresponding pads in the third set of pads 118. For example, pad 110(a) may be electrically continuous with pad 118(a), pad 110(b) may be electrically continuous with pad 118(b), and so on. A fourth set of pads 120 corresponding to the third set of pads (and electrically continuous with those pads) may also be provided on bottom surface 132 of flexible substrate 104.

In accordance with one aspect of the present invention, the first set of pads 110 are preferably configured to interface with a board 106 via corresponding solder balls 112 (or other appropriate bonding method), and the third set of pads 118 are preferably configured to interface with a semiconductor device (for example, a ball grid array (BGA) device) via corresponding solder balls 116. Thus, the second set of pads 108 (and/or the fourth set of pads 120) may be electrically probed while the semiconductor is in an operational state. This allows testing of the device in-situ.

Semiconductor device 102 may be fabricated using any suitable semiconductor material and may comprise any convenient package configuration. Suitable materials for device 102 include, for example, group IV semiconductors (i.e., Si, Ge, and SiGe), group III-V semiconductors (i.e., GaAs, InAs, and AlGaAs), and other less-conventional materials, such as SiC, diamond, and sapphire. The device may comprise single crystal material, a silicon-on-insulator material (SOI), or one or more polycrystalline or amorphous epitaxial layers formed on a suitable base material. It will be appreciated that device 102 will also include various electronic components incorporated into the semiconductor material as well as interconnect structures consisting of conductive paths and various dielectrics for isolating these conductive paths. Such electronic components and processing methods are well known and therefore will not be discussed in detail herein. In this regard, it will be appreciated that the present invention is not limited to a particular class of electronic components. That is, semiconductor device 102 may include any combination of digital and/or analog semiconductor devices, including, for example, microprocessors, microcontrollers, application specific integrated circuits (ASICs) static or dynamic memory devices, integrated optic devices, integrated sensors, and field-effect transistor power semiconductors. The present invention may be used in connection with a wide variety of packages, e.g. ball-grid arrays (BGAs), chip-scale packages (CSPs) thin quad flat-packs (TQFPs), thin small outline packages (TSOPs), and any other package having a plurality of leads or contacts.

Depending upon the application, board 106 may include rigid board materials (e.g., FR-4 and BT), ceramics, polyimide flex circuits, metallic leadframes or any other suitable material. In one embodiment, board 106 may also include a pattern of conductors between the various pads 114, and might therefore include a multilevel metallization scheme which accommodates the conductor/bond pad topology.

Interposer 103 is "flexible" in the sense that it undergoes substantially elastic deformation in bending when subjected to reasonable strain values. In one embodiment, for example, interposer 103 can bend to approximately 70-90 degrees without appreciable damage to the conductive traces provided therein.

The flexibility of interposer 103 allows the device to be advantageously positioned within the test apparatus. That is, referring to FIG. 1, interposer 103 generally bends at approximately its midsection (the "bending region", as discussed below) such that device 102 may be raised and/or lowered to avoid other components in the vicinity of device 102, for example, region 150 above board 106, which might be populated by one or more other components. In this way, interposer 103 allows for gradual transition away from board 106, and provides a scheme for testing devices configured in a tight pitch. Interposer 103 may also be positioned such that device 102 is generally located above and in contact with another component located in region 150.

Figure 5A:
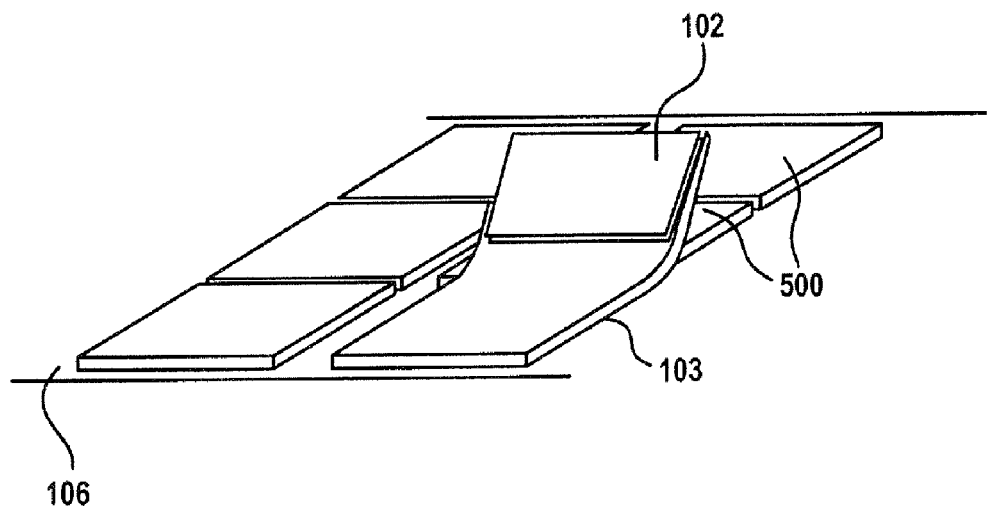
FIGS. 5A and 5B show an exemplary interposer attached to a board in various orientations.
Figure 5B:
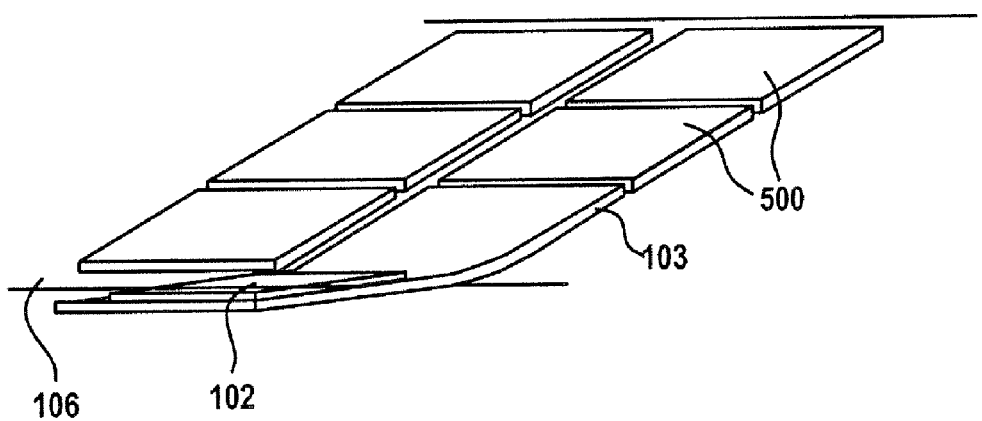

With reference to the isometric views shown in FIGS. 5A and 5B (which, for the purposes of simplicity, do not show the respective pads), interposer 103 may be positioned, for example, "into" board 106 (FIG. 5A), thus extending over one or more adjacent devices 500, or "out of" board 106 (FIG. 5B), thus extending over the side of board. Interposer 103 may be attached to the board in any appropriate orientation. Moreover, multiple interposers may be attached to board 106 such that one or more of the interposers overlap or become "stacked" on top of each other.

Figure 2:
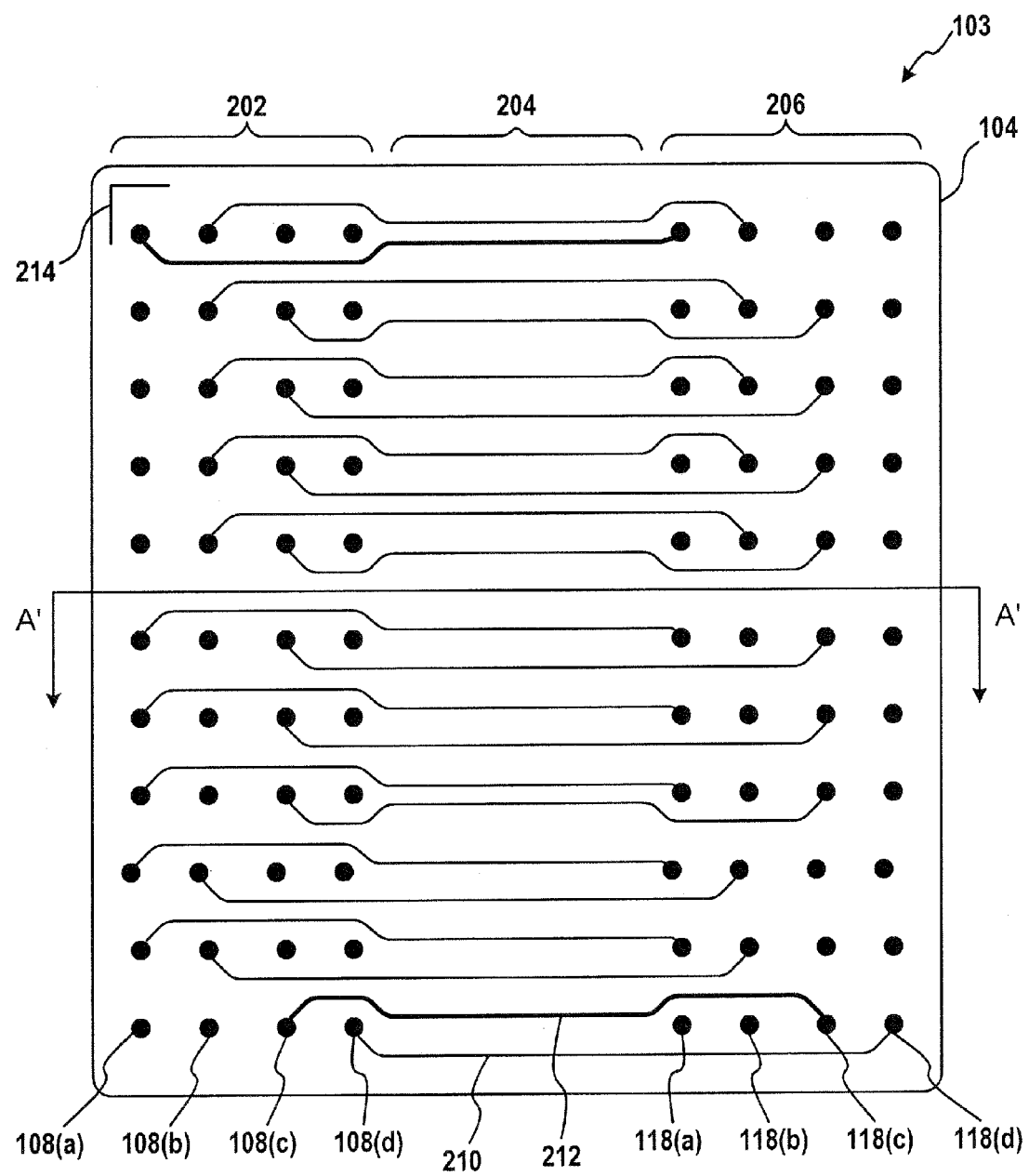
FIG. 2 is a top view of an exemplary flexible circuit interposer in accordance with one embodiment of the present invention.

Referring now to the top view diagram shown in FIG. 2, pads 108 may be configured in a pattern 202 on one end of interposer 103, and pads 118 may be configured in a pattern 206 on an opposite end of interposer 103. A bending region 204 devoid of pads may be provided between the respective sets of pads. Although a 44-pin pattern is shown in FIG. 2, the present invention is not so limited, and may be used in connection with higher pin-count devices, including 65-pin, 144-pin, and higher pin-count devices.

As mentioned above, one or more conductive traces may be provided to map a subset of pads 108 with a spatially-corresponding pads 118. The phrase "spatially-corresponding" is intended to refer to the position of the pads within their respective patterns (i.e., patterns 202 and 206). For example, as shown in the illustrated embodiment, pad 108(c) is connected to pad 118(c) via a trace 212, and pad 108(d) is connected to pad 118(d) via a trace 210. Each of these pairs of pads are in the substantially the same location with respect to the pad pattern, which, in the illustrated embodiment, is a rectangular array having four columns and eleven rows. Those skilled in the art will recognize, however, that the present invention may be used in connection with any pad pattern currently known or developed in the future.

While the embodiment shown in FIG. 2 shows only a portion of respective pads connected by conductive traces, it may also be advantageous to connect all or nearly all of the respective pads together. In such a case, however, as discussed further below, it may be desirable to use multiple-layers of conductive traces to avoid collisions between traces within a given layer.

In accordance with one aspect of the present invention, patterns 202 and 206 correspond to rectangular arrays of pads having an aspect ratio of between approximately 2:1 and 4:1, preferably about 3:1. In accordance with another aspect of the present invention, bending region 204 is suitably about the width of pattern 204. The present invention is not so limited, however, and comprehends any suitable combination of pad aspect ratio and bending region dimensions.

Figure 3:
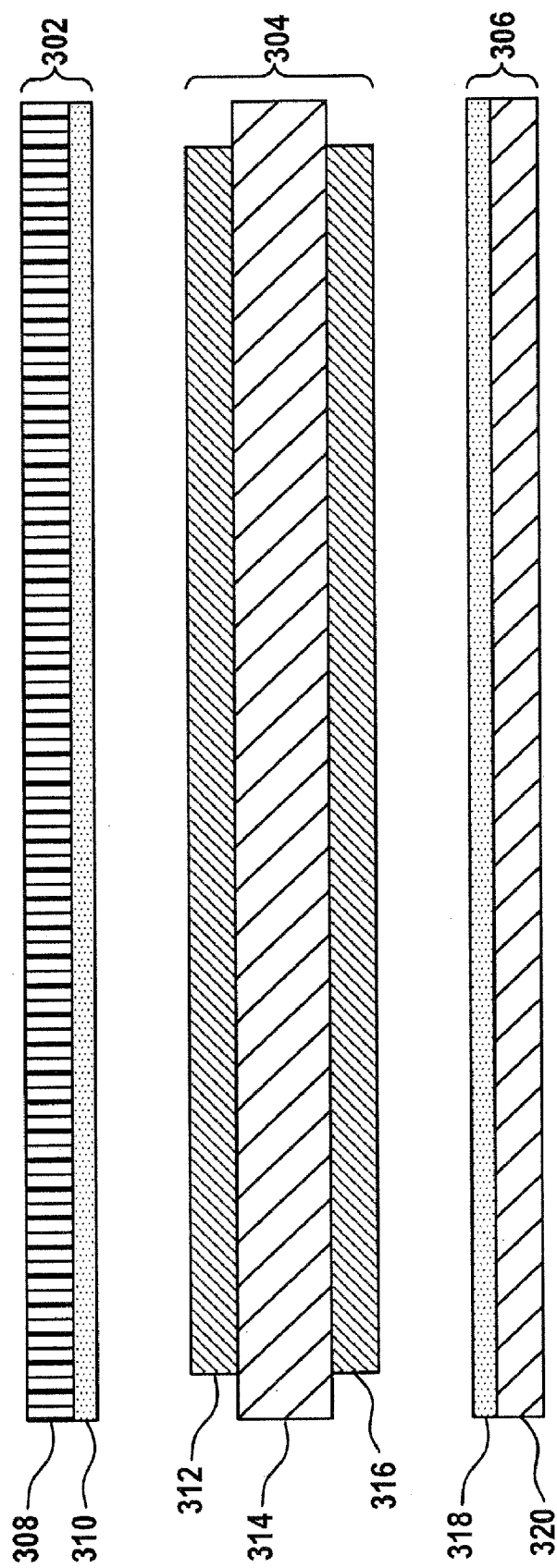
FIG. 3 is a cross-sectional diagram of various components that may be used in constructing a flexible circuit interposer in accordance with the present invention.

Referring now to the cross-sectional (see A' in FIG. 2) diagram shown in FIG. 3, the present invention may be fabricated using a flexible, conductor-clad middle section 304 sandwiched between two covering overlays (or "coverlays") 302 and 306.

In one embodiment, middle section 304 includes a polymeric layer 314 (for example, polyimide) clad with thin copper layers 312 and 316. The copper layers 312 and 316 may be formed using any convenient technique, for example, through thermal-compression bonding of copper foil (e.g., 0.5 oz. copper foil). A number of materials are suitable for middle layer 304, including, for example, any of the various copper-clad laminates manufactured by Dupont, such as PYRALUX Model Number AP8525 double-sided copper-clad polyimide. The thickness of section 304 may also be selected in accordance with, for example, the desired flexibility. In one embodiment, for example, the thickness of section 304 is approximately 50.0 microns.

An appropriate conductive trace pattern connecting one or more spatially corresponding pads may be formed using layer 312, layer 316, or both. Furthermore, it may be desirable to use three, four, or even more layers to form the conductive traces. Formation of the conductive traces may be accomplished using a variety of conventional techniques, for example, using standard wet or dry photolithographic techniques.

Coverlay 302 suitably includes a flexible layer 308 (for example, polyimide) and an adhesive layer 310 (for example, an acrylic or epoxy adhesive). Similarly, coverlay 306 suitably includes a flexible layer 320 and an adhesive layer 318. Adhesive layer 310 acts to bond layer 308 to layer 312 (and exposed areas of layer 314), and adhesive layer 318 acts to bond layer 320 to layer 316 and any exposed areas of layer 314.

A variety of materials are suitable for coverlays 302 and 306, including, for example, any of the various flexible composite coverlays manufactured by Dupont, such as Dupont's PYRALUX Model FR7001 laminate. The thickness of coverlays 302 and/or 306 may be selected in accordance with the application. In one embodiment, the coverlays have a thickness of approximately 25.0 microns.

Figure 4:
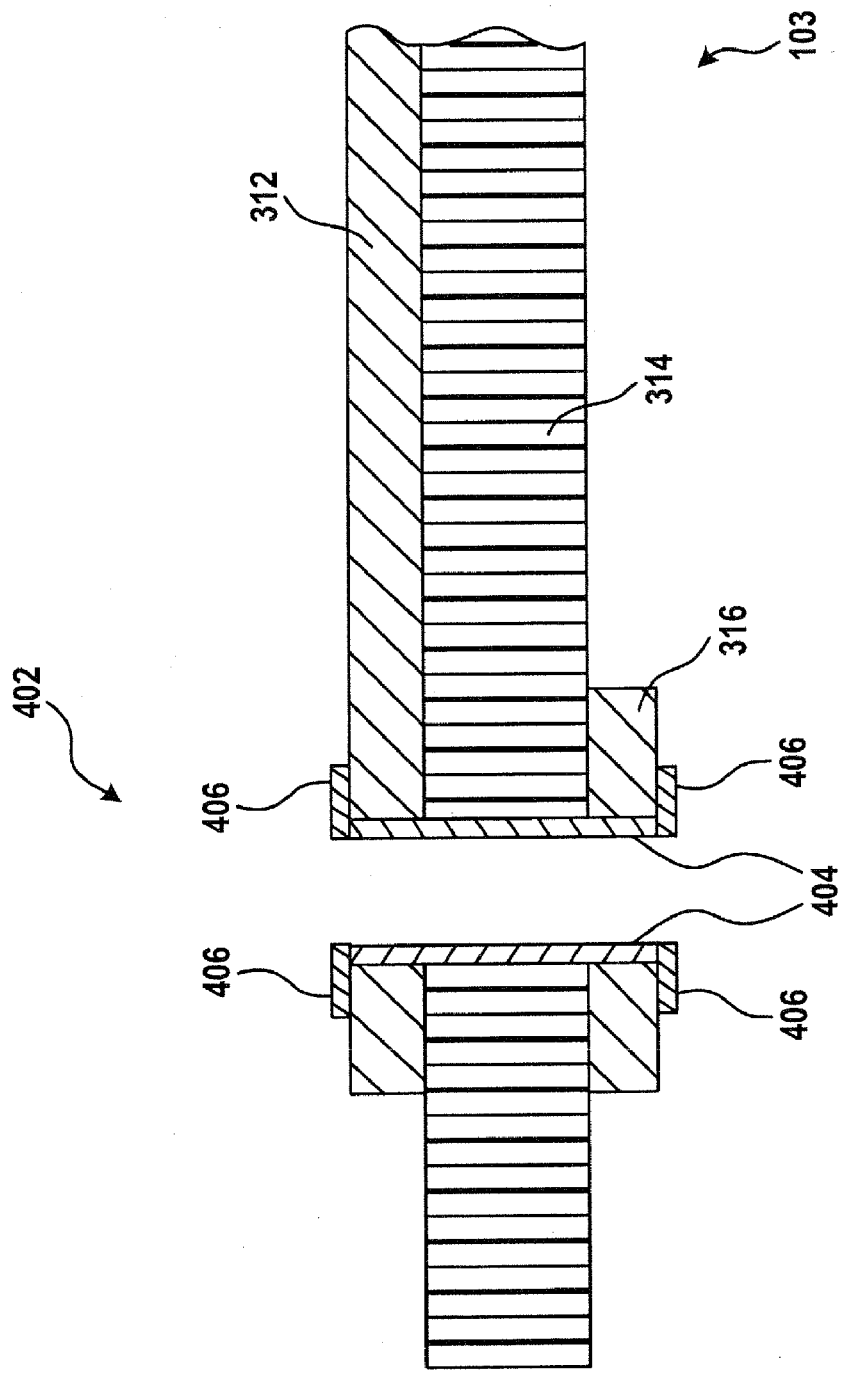
FIG. 4 is a cross-sectional diagram showing a through-hole provided within a flexible circuit interposer in accordance with the present invention.

Referring now to the cross-sectional (see A' in FIG. 2) diagram shown in FIG. 4, a through-hole 402 may be formed between conductive layer 312 and conductive layer 316. If coverlays are to be used as described above, through-holes 402 may be formed after application of the coverlays.

Through-hole 402 includes a conductive wall 404 and, optionally, pads 406 on opposite sides of interposer 103. Through holes 402 may have any suitable dimensions depending upon the application. In the illustrated embodiment, the through-holes have an as-plated diameter of approximately 0.008 inches. In one embodiment, the walls 404 comprise a copper layer no less than approximately 0.001 inches thick, and pads 406 comprise a gold layer (for example, an electroplated gold layer having a thickness of from about 3-10 micro-inches) over a nickel layer (for example, a layer of low-stress nickel having a thickness of approximately 300 micro-inches).

In one embodiment, pads 406 are square pads having approximately 0.010 inch sides. It will be appreciated, however, that any suitable shape may be used for pads 406. The through-holes 402 are positioned to intersect with the appropriate pads 406 to provide the desired electrical connectivity. In addition, the pads may be enlarged in certain regions to accommodate variations in through-hole placement and thus increase the manufacturability of the interposer. For example, in one embodiment a "tear-drop" pattern is added to conductive traces at the pads. Addition information regarding the manufacturing of through-holes and other conventional packaging techniques may be found in a number of standard texts, e.g., Seraphim, Lasky, and Li, PRINCIPLES OF ELECTRONIC PACKAGING (1989).

In summary, methods and apparatus in accordance with the present invention provide an improved, flexible circuit interposer which allows in-situ probing of an attached device during, for example, circuit debugging, assembly qualification, and the like.

The present invention is described with reference to various preferred embodiments. However, changes and modifications may be made to various exemplary embodiments without departing from the scope of the present invention. These and other changes or modifications are intended to be included within the scope of the present invention as set forth in the appended claims.

The invention claimed is:

1. A substrate comprising:
    a top surface;
    a bottom surface;
    a bending region formed between a first end of the substrate and a second end of the substrate, wherein the bending region is configured to elastically deform; and
    one or more conductive paths from a first region on the bottom surface and the first end of the substrate to a second region on the top surface and the second end of the substrate, wherein the one or more conductive paths comprises a first pattern formed in the first region and a second pattern formed in the second region, wherein the first pattern is identical to the second pattern.

2. The substrate, as set forth in claim 1, wherein the first region comprises a first plurality of conductive pads and the second region comprises a second plurality of conductive pads.

3. The substrate, as set forth in claim 2, wherein the first plurality of conductive pads and the second plurality of conductive pads are spatially corresponding.

4. The substrate, as set forth in claim 2, wherein the first plurality of conductive pads is configured to be coupled to a circuit board.

5. The substrate, as set forth in claim 2, wherein the second plurality of conductive pads is configured to be coupled to a semiconductor device.

6. The substrate, as set forth in claim 1, comprising a third region electrically coupled to each of the first region and the second region and having a third pattern wherein the third pattern is identical to the first pattern.

7. The substrate, as set forth in claim 6, wherein the third region comprises a third plurality of conductive pads configured to receive a test probe.

8. The substrate, as set forth in claim 1, wherein the bending region is configured to bend from 0-90 degrees.

9. The substrate, as set forth in claim 1, wherein the bending region is configured to bend from 70-90 degrees.

10. A substrate comprising:
    a top surface;
    a bottom surface;
    a bending region formed between a first end of the substrate and a second end of the substrate, wherein the bending region is configured to elastically deform;
    a first pattern of electrical contacts on the bottom surface near the first end;
    a second pattern of electrical contacts on the top surface near the second end; and wherein the first pattern of electrical contacts is identical to the second pattern of electrical contacts, and wherein there is at least one conductive path between one of the electrical contacts of the first pattern of electrical contacts with one of the electrical contacts of the second pattern of electrical contacts.

11. The substrate of claim 10, comprising a plurality of electrically conductive paths.

12. The substrate of claim 11, wherein each of the plurality of electrically conductive paths connects one of the electrical contacts of the first pattern of electrical contacts with at least one of the electrical contacts of the second pattern of electrical contacts.

13. The substrate of claim 12, wherein each of the plurality of electrically conductive paths connects one of the electrical contacts of the first pattern of electrical contacts with the respective electrical contact of the second pattern of electrical contacts.

* * * * *